United States Patent
Vincent et al.

(10) Patent No.: US 6,583,048 B2
(45) Date of Patent: Jun. 24, 2003

(54) ORGANOSILICON PRECURSORS FOR INTERLAYER DIELECTRIC FILMS WITH LOW DIELECTRIC CONSTANTS

(75) Inventors: Jean Louise Vincent, Bethlehem; Mark Leonard O'Neill, Allentown; Howard Paul Withers, Jr., Breinigsville; Scott Edward Beck, Kutztown; Raymond Nicholas Vrtis, Allentown, all of PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/944,042

(22) Filed: Aug. 31, 2001

(65) Prior Publication Data

US 2002/0142579 A1 Oct. 3, 2002

Related U.S. Application Data

(63) Continuation-in-part of application No. 09/761,269, filed on Jan. 17, 2001, now abandoned.

(51) Int. Cl.$^7$ ........................................... H01L 21/4763
(52) U.S. Cl. ..................................................... 438/623
(58) Field of Search ............................... 438/623, 743, 438/763, 770, 773, 622

(56) References Cited

U.S. PATENT DOCUMENTS

| | | | |
|---|---|---|---|
| 4,988,573 A | 1/1991 | Nakayama et al. | 428/421 |
| 5,948,928 A | 9/1999 | Siegele et al. | 556/442 |
| 5,989,998 A | 11/1999 | Sugahara et al. | 438/623 |
| 6,020,458 A | 2/2000 | Lee et al. | 528/401 |
| 6,054,206 A | 4/2000 | Mountsier | 428/312.8 |
| 6,054,379 A | 4/2000 | Yau et al. | 438/623 |
| 6,072,227 A | 6/2000 | Yau et al. | 257/642 |
| 6,086,952 A | 7/2000 | Lang et al. | 427/255.29 |
| 6,147,009 A | 11/2000 | Grill et al. | 438/780 |
| 6,159,871 A | 12/2000 | Lobada et al. | 438/786 |
| 6,171,945 B1 | 1/2001 | Mandal et al. | 438/622 |
| 6,225,238 B1 * | 5/2001 | Wu | 438/778 |
| 6,440,876 B1 * | 8/2002 | Wang et al. | 438/778 |
| 6,441,491 B1 | 8/2002 | Grill et al. | 257/759 |

FOREIGN PATENT DOCUMENTS

| | | | |
|---|---|---|---|
| EP | 0469926 | 5/1992 | ............... C08J/7/06 |
| EP | 0935283 | 8/1999 | ........... C23C/16/40 |
| EP | 1123991 | 8/2001 | ........... C23C/16/40 |
| JP | 1088352 | 4/1998 | ........... C23C/16/30 |
| JP | 1111712 | 4/1999 | ......... H01L/21/316 |
| WO | 9938202 | 7/1999 | ........... C23C/16/40 |
| WO | 9941423 | 8/1999 | |

OTHER PUBLICATIONS

M.J. Loboda, et al., "Deposition of Low–K Dielectric Films Using Trimethylsilane," in *Electrochemical Soc. Proc.*, V. 98–6, pp. 145 to 152.

"Low–k Dielectrics: Will Spin–On or CVD Prevail?", in *Semiconductor International*, Jun. 2000, pp. 1 to 10.

Gill Yong Lee, et al., "Recent Progress in PECVD Low–k Dielectrics for Advanced Metallization Schemes", 198$^{th}$ Meeting of the Electrochemical Society, Oct. 2000, Section H–1, Abstract No. 531.

Patent Application Publication US 2002/0072220 A1, Wang, et al., "Low–K Dielectric CVD Precursors and Uses Thereof", Pub. Date: Jun. 13, 2002, filed: Oct. 5, 2001.

* cited by examiner

*Primary Examiner*—David Nelms
*Assistant Examiner*—Thao P Le
(74) *Attorney, Agent, or Firm*—Mary E. Bongiorno

(57) ABSTRACT

A method of forming a low dielectric constant interlayer dielectric film on a substrate by reacting, under chemical vapor deposition conditions sufficient to deposit the film on the substrate, an organosilicon precursor comprising a silyl ether, a silyl ether oligomer, or an organosilicon compound containing one or more reactive groups, to form an interlayer dielectric film having a dielectric constant of 3.5 or less. The films formed by the above method.

56 Claims, 1 Drawing Sheet

ORGANOSILICON PRECURSORS FOR INTERLAYER DIELECTRIC FILMS WITH LOW DIELECTRIC CONSTANTS

CROSS REFERENCE TO RELATED APPLICATIONS

This is a continuation in part of application Ser. No. 09/761,269 filed on Jan. 17, 2001 abandoned.

BACKGROUND OF THE INVENTION

The electronics industry utilizes dielectric materials as insulating layers between circuits and components of integrated circuits (IC) and associated electronic devices. Line dimensions are being reduced in order to increase the speed and storage capability of microelectronic devices (e.g. computer chips). Microchip dimensions have undergone a significant decrease in the past decade such that line widths previously about 1 micron are being decreased to 0.18 micron with forecasts for as low as 0.10–0.05 in the next 5–10 years. As the line dimensions decrease, the requirements for preventing signal crossover (crosstalk) between chip components become much more rigorous. These requirements can be summarized by the expression RC, where R is the resistance of the conductive line and C is the capacitance of the insulating dielectric interlayer. C is inversely proportional to spacing and proportional to the dielectric constant (k) of the interlayer dielectric (ILD). Thus, shrinking the spacing requires a lower k to maintain an acceptable RC.

Historically, silica ($SiO_2$) with a dielectric constant of 4.2–4.5 has been employed as the ILD. However, at line dimensions less than 0.18 microns, silica is no longer acceptable and an ILD with a k of 2.4–3.3 and below is needed.

Two general approaches to making a low k ILD are spin-on and chemical vapor deposition (CVD). Although both methods are capable of generating a low k ILD, CVD processes have the advantage of being able to utilize existing toolsets. Another advantage to CVD is simpler integration due to the silica-like structure of CVD-produced films compared to organic polymer films produced by some spin-on processes. CVD is also thought to have better conformality and gap filling capability than the spin-on method.

The current method of choice for dissociating or activating the reactive gases in a CVD chamber is by using a RF coupled plasma in a reaction zone above the substrate, such as that described in WO9941423. In plasma enhanced chemical vapor deposition (PECVD) the temperature required for the dissociation and deposition is typically between 100 and 400° C., which is generally lower than temperatures required for thermal CVD.

Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating film with carbon atoms, fluorine atoms, or organic groups containing carbon and fluorine. Carbon doped silica, having the general formula, $Si_aO_bC_cH_d$, (in which the atomic % of a+b+c+d= 100%; a=10–35%, b=1–66%, c=1–35%, d=0–60%) will be referred to herein as organosilicate glass or OSG. Fluorine and carbon doped silica, having the general formula, $Si_aO_b$-$C_cH_dF_e$ (wherein the atomic % of a+b+c+d+e=100% and a=10–35%, b=1–66%, c=1–35%, d=0–60%, and e=0.1–25%) will be referred to as F-OSG. The ratio and structural arrangement of carbon, silicon, oxygen, fluorine, and hydrogen atoms in the final ILD is dependent on the precursors chosen, the oxidant, and the CVD process conditions, such as RF power, gas flow, residence time, and temperature.

Doping the silica with carbon atoms or organic groups lowers the k of the resulting dielectric film for several reasons. Organic groups, such as methyl, are hydrophobic; thus, adding methyl or other organic groups to the composition can act to protect the resulting CVD deposited film from contamination with moisture. The incorporation of organic groups such as methyl or phenyl can also serve to "open up" the structure of the silica, possibly leading to lower density through space-filling with bulky $CH_x$ bonds. Organic groups are also useful because some functionalities can be incorporated into the OSG, and then later "burned out" or oxidized to produce a more porous material which will inherently have a lower k. The incorporation of voids or pores in a low dielectric constant material will result in reductions in the dielectric constant proportional to the amount of porosity. While this is beneficial, the amount of porosity incorporated into the film must be balanced with the deleterious effects that the introduction of pores will have on the mechanical properties of the film. Thus the optimum amount of porosity will be material dependant.

Doping the ILD with fluorine provides low polarizability, thus leading to lower k. Fluorine-containing organic groups such as $CF_3$ are very hydrophobic, so their presence will also serve to protect the silica from contamination with moisture.

While fluorinated silica materials have the requisite thermal and mechanical stability to withstand very high temperatures (up to 500° C.), the materials' properties (e.g., low water sorption, mechanical properties) are susceptible to being compromised when large amounts of fluorine are incorporated into the material. Fluorinated organic materials, such as poly(tetrafluoroethylene) despite having very low k values down to 2.0 or less, have not shown sufficient stability to the temperatures experienced during subsequent processing steps involved in the manufacture of an integrated circuit. Organic polymers in general do not possess sufficient mechanical strength for processing under current conditions. Also, fluorocarbon polymers can have other drawbacks such as poor adhesion, potential reaction with metals at high temperature, and poor rigidity at high temperature in some cases.

One way to incorporate carbon into an ILD is by using an organosilane such as methylsilanes $(CH_3)_xSiH_{4-x}$ as a silicon source in the PECVD reaction. WO9941423 and U.S. Pat. No. 6,054,379 describe the reaction of a silicon compound containing methyl groups and Si—H bonds with nitrous oxide ($N_2O$) oxidant to give an SiOC film with a carbon content of 1–50% by atomic weight and a low dielectric constant.

U.S. Pat. No. 6,159,871 disclose methylsilanes $(CH_3)_x$ $SiH_{4-x}$ (x is 1–4) as suitable CVD organosilane precursors to OSG low k films. Materials with 10–33% carbon content, by weight, and k less than 3.6 are reported.

An article by M. J. Loboda, et al., entitled "Deposition of Low-K Dielectric films using Trimethylsilane," in *Electrochemical Soc. Proc.*, Vol. 98–6, pages 145 to 152, describes the use of trimethylsilane in a PECVD process to provide films with a k of 2.6 to 3.0.

Other patents describe the use of phenyl or vinyl containing organosilane precursors in producing dielectric films. For example, U.S. Pat. No. 5,989,998 discloses the preparation of PECVD low k films from, for example, $(C_6H_5)_x SiH_{4-x}$ or $(CH_2=CH)_x SiH_{4-x}$ (x is 1,2 or 3), and an oxidizing gas. WO 9938202 discloses dielectric films deposited from phenyl or methylsilanes with hydrogen peroxide as the oxidant and the addition of oxygen to aid in the association between the silicon compound and the oxidant.

WO 9941423 and EP 0935283 A2 disclose siloxanes such as $H(CH_3)_2SiOSi(CH_3)_2H$, $(CH_3)_3SiOSi(CH_3)_3$, and cyclic $(-OSiH(CH_3)-)_4$ as precursors for PECVD produced OSG films.

Silyl ethers (alkoxysilanes) have also been disclosed as precursors for dielectric films. EP 0935283 A2 discloses methoxy and ethoxysilanes, such as $(CH_3)_2Si(OCH_3)_2$ and $(CH_3)(C_6H_5)Si(OCH_3)_2$. U.S. Pat. No. 6,086,952 discloses a method of forming thin polymer layers by blending reactive p-xylylene monomers with one or more comonomers having silicon-oxygen bonds and at least two pendent carbon-carbon double bonds, such as tetraallyloxysilane.

U.S. Pat. No. 6,171,945 discloses a process in which organosilanes with "labile" ligands, such as formyl or glyoxyl groups, are reacted with a peroxide compound at the surface of the substrate, and are subsequently removed by annealing to provide a porous ILD.

U.S. Pat. No. 6,054,206 discloses deposition of a film using an organosilane and an oxidant, followed by removal of the organic component in the film with an $O_2$ plasma to generate a porous silica material.

F-OSG is typically prepared by CVD using organosilane precursors with methyl or phenyl C—F bonds. For example, WO 9941423 discloses the use of PECVD for a number of organosilane precursors with $sp^3$-hybridized C—F bonds such as $(CF_3)SiH_3$.

JP11-111712 describes the preparation of films from the deposition of $(CF_3)Si(CH_3)_3$, followed by thermal treatment with $O_2$ to generate an insulating film with a k of 2.5 to 2.6.

U.S. Pat. No. 6,020,458 teaches that the use of $sp^2$-hybridized C—F bonds, such as those in $(C_6F_5)SiH_3$, is preferable due to the stronger C—F bond strength, leading to greater thermal stability of the resultant ILD films.

JP10-088352 discloses the possible use of $(R^1O)_n Si(OR^2)_{4-n}$ ($R^1$ is a fluorinated alkyl chain and $R^2$ is an non-fluorinated alkyl chain) as a precursor for a fluorine containing silicon oxide film. U.S. Pat. No. 5,948,928 discloses the possible use of fluoroacetate substituted silanes as insulating film precursors. However, both JP 10-088352 and U.S. Pat. No. 5,948,928 are directed to the preparation of fluorosilicate glass (FSG), not F-OSG films.

Inadequacies exist in currently known CVD precursors and the corresponding ILD films. One problem is that it can be difficult to include all atoms or functionalities desired in the film in the same precursor molecule, in the desired ratio to produce a $Si_aO_bC_cH_d$ or $Si_aO_bC_cH_dF_e$ film, in which the total atomic % of a+b+c+d+e=100%, and a=10–35%, b=1–66%, c=1–35%, d=0–60%, and e=0–25%. Heterogenous mixtures of precursors can be used, but this is less desirable to a single-source precursor for process reasons.

The deposited ILD films should be able to withstand temperatures up to 450° C., since some Si—H, Si—C, C—H, or C—F bonds can be broken at high temperatures. Release of F ions or radicals can etch the film or other components.

The low k ILD must also have suitable mechanical strength. When new low k films are substituted for traditional $SiO_2$, subsequent integration process steps are impacted. The deposited films need to stand up to subsequent processes including chemical mechanical planarization (CMP), cap and barrier layers, and photoresist adhesion, stripping, etching and ashing.

Studies have indicated that current OSG candidates produced from trimethylsilane (3 MS) or tetramethylsilane (4 MS) limit the dielectric constant to the range of 2.6–2.9 with modulus/hardness values in the range of 4–11/0.25–1.4 GPa (Lee et al., $198^{th}$ Meeting of The Electrochemical Society, October 2000, Section H-1, Abstract No. 531.)

Precursors which are safe to handle and possess long shelf lives (greater than 1 year) are also desirable. Silane ($SiH_4$) is a pyrophoric gas, and methyl, dimethyl, or trimethylsilane are all highly flammable gases.

Finally, the CVD organosilicon precursors need to be readily available and affordable.

Despite the foregoing developments, there have not been any examples in the prior art that successfully combine the desired mechanical and electrical properties that are paramount for integrating low k dielectric materials in integrated circuits.

The need therefore remains for precursors of low k ILD films that solve the problems associated with known precursors, such as those described above.

BRIEF SUMMARY OF THE INVENTION

This invention is directed to a method of making ILD films having a k of 3.5 or less, preferably 3 or less, by chemical vapor deposition (CVD), such as plasma enhanced CVD (PECVD) or thermal CVD, using specific organosilicon precursors. This invention is also directed to the films produced therefrom, and to methods of using the films.

The low k ILD films can be deposited as either OSG ($Si_aO_bC_cH_d$) or F-OSG ($Si_aO_bC_cH_dF_e$) films (wherein the atomic % of a+b+c+d+e=100% and a=10–35%, b=1–66%, c=1–35%, d=0–60%, and e=0–25%). An oxidant such as $N_2O$, $O_2$, $O_3$, or $H_2O_2$ may be used in the CVD reactor, but may not be required in all cases since many of the precursors already incorporate Si—O bonds. Novel porous ILD films may also be produced using these specific organosilicon precursors.

The specific organosilicon precursors of this invention are silyl ethers, silyl ether oligomers, and organosilicon compounds containing reactive groups.

The silyl ethers of this invention can have a structure as shown in structures I–VII, below, where x is an integer of 1 to 3, y is 1 or 2, and z is an integer of 2 to 6.

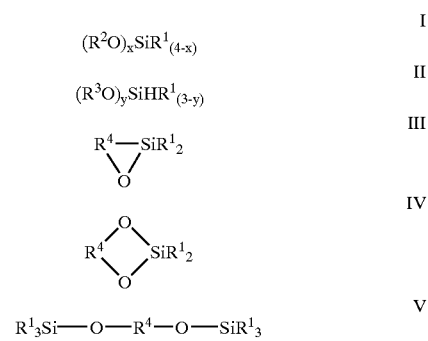

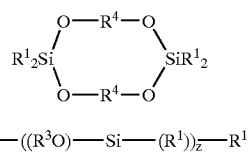

VI

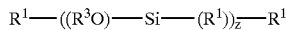

VII $R^1$ can be one or more of H, fluorine, a branched or straight chain C1 to C6 alkyl, a C3 to C8 substituted or unsubstituted cycloalkyl, a C6 to C12 substituted or unsubstituted aromatic, a partially or fully fluorinated C1 to C6 alkyl, a partially or fully fluorinated C3 to C8 cycloalkyl, or a partially or fully fluorinated C6 to C12 aromatic. Examples of $R^1$ are unfluorinated, partially fluorinated, or fully fluorinated methyl, ethyl, propyl, isopropyl, cyclopentyl, cyclohexyl, methylcyclohexyl, phenyl, and tolyl.

$R^2$ can be one or more of a C6 to C12 substituted or unsubstituted aromatic such as phenyl, tolyl, or pentamethylphenyl, a fluorinated straight chain, branched chain or cycloalkyl up to $C_8F_{15}$, such as trifluoromethyl and pentafluoroethyl, or partially or fully fluorinated aromatic group, such as $C_6H_3F_2$ or $C_6F_5$.

$R^3$ can be one or more of $R^2$, a C1 to 6 linear or branched alkyl, or a C3 to C8 substituted or unsubstituted cycloalkyl, such as methyl, cyclohexyl, phenyl, or tert-butyl.

$R^4$ can be one or more of a C1 to C6 linear or branched alkyl, C3 to C8 substituted or unsubstituted cycloalkyl, or C6 to C12 substituted or unsubstituted aromatic and can be partially or fully fluorinated. Examples of $R^4$ are unfluorinated, partially fluorinated, or fully fluorinated methylene, ethylene, and phenylene.

Examples of compounds having structure VII are disilane or trisilane containing alkoxy ligands, such as $H(CH_3O)(CH_3)Si$—$Si(CH_3)(OCH_3)H$.

Structures I and II contain monodentate alkoxy groups, with one Si—O bond per $OR^2$ or $OR^3$ group. In structure II, the $R^4$ alkoxy group can be bidentate with one Si—O bond and one Si—C bond per $R^4$ group. In structure IV, $R^4$ is a bidentate alkoxy structure with two Si—O bonds per $R^4$ group. In structures V and VI, the $R^4$ alkoxy group forms bridged structures with two Si—O bonds.

A major advantage in using silyl ethers of this invention, having Si—O—C bonds, to dope organic or organofluorine groups into the ILD film, instead of silanes having only Si—C and Si—H bonds, is that Si—O—C bonds are more convenient to form than Si—C bonds. In addition, starting materials for silyl ethers are readily available and inexpensive, and silyl ethers are safer to handle than silanes. Most of the silyl ethers described in this invention are flammable liquids, while silane ($SiH_4$) is a pyrophoric gas, and methyl-, dimethyl-, and trimethyl-silane are highly flammable gases.

The organosilicon precursors containing reactive groups have the general structure $R^1_{4-x}SiR^5_x$ in which x is an integer of 1 to 3, $R^1$ is as described above for structures I–VII, and $R^5$ is a reactive group. A reactive group is typically defined as chemical bond(s) between two (or more) atoms which can be broken using a minimal amount of energy, is strained, or is not in a thermodynamically preferred configuration, and has a propensity to form new chemical bonds or crosslinked structures with other chemical species. Reactive groups can aid in the crosslinking of the deposited film which enhances the thermal stability and mechanical strength of the ILD film. Examples of reactive side groups include C2 to C10 epoxides such as ethylene oxide or 2-ethyloxirane, C2 to C8 carboxylates such as methyl acetate or ethyl acetate, C2 to C8 alkynes such as propyne, ethyne, and phenylethyne, C4 to C8 dienes such as 1,3-butadiene, 1,4 octadiene or 1,3 cyclopentadiene, C3 to C5 strained rings such as cyclopropane or 2-cyclobutene, and C4 to C10 organic groups, such as tert-butyl, tert-butyloxide, or adamantane, that can sterically hinder or strain the organosilicon precursor. Examples of organosilicon compounds containing reactive groups are trimethylsilylacetylene, 1-(trimethylsilyl)-1,3-butadiene, trimethylsilylcyclopentadiene, trimethylsilylacetate, and di-tert-butyoxydiacetoxysilane.

DETAILED DESCRIPTION OF THE INVENTION

Figure 1:
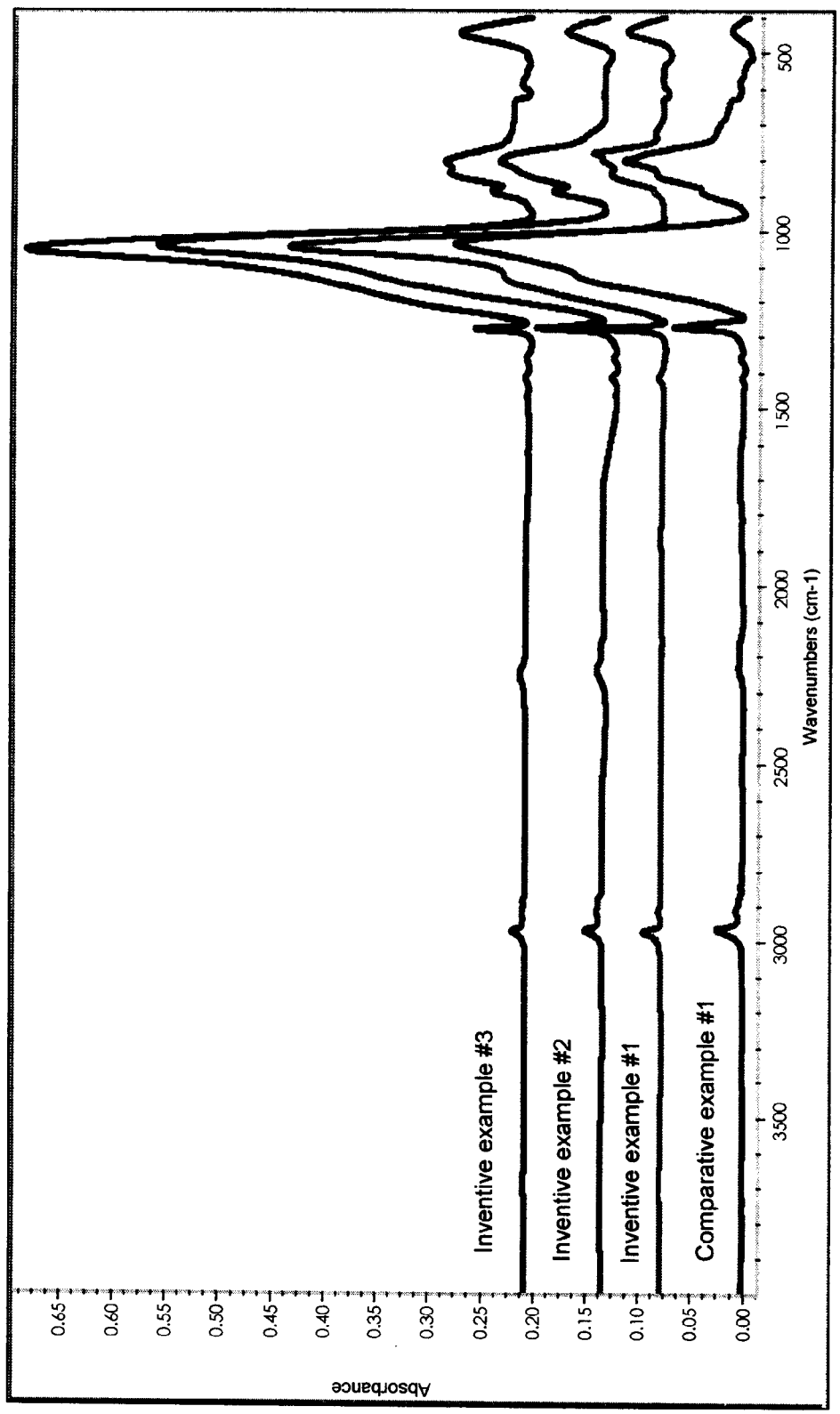
FIG. 1 shows IR spectra for comparative example 2 and inventive examples 1,2, and 3. Absorbencies were normalized to film thickness and baseline offset for clarity.

This invention is directed to a method of making ILD films having a k of 3.5 or less, preferably 3 or less, by chemical vapor deposition (CVD), using specific organosilicon precursors. The specific organosilicon precursors of this invention are silyl ethers, silyl ether oligomers, and organosilicon compounds containing reactive groups.

Table 1 and 2 present examples of silyl ethers of this invention having structures I–VII, including those in which the silyl ether may be an oligomer.

TABLE 1

| Organosilicon Precursor | Examples of Substituents | Specific Examples |
|---|---|---|
| $(R^2O)_xSiR^1_{(4-x)}$ | x = 1–3<br>$R^1$ = H, $CH_3$, $C_2H_5$, $C_6H_5$,<br>$(CH_3)_{5-y}C_6H_y$ (y = 1–5), (tert-Bu)$C_6H_4$, cyclic $C_6H_{11}$<br>$R^2$ = $C_6H_5$, $(CH_3)C_6H_4$,<br>$(OCH_3)C_6H_4$, $(CH_3)_5C_6$, (tert-Bu)$C_6H_4$, cyclic-$C_6H_{11}$ | phenoxytrimethylsilane<br>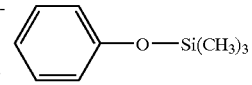<br>2-tert-butylphenoxy-trimethylsilane<br>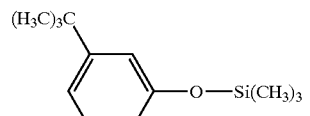 |

TABLE 1-continued

| Organosilicon Precursor | Examples of Substituents | Specific Examples |
|---|---|---|
| $(R^3O)_xSiHR^1{}_{(3-x)}$ | x = 1–2<br>$R^3$ = $CH_3$, $C_2H_5$, $R^2$ | dimethylethoxysilane<br>$(CH_3CH_2O)SiH(CH_3)_2$<br>dimethoxymethylsilane<br>$(CH_3O)_2SiH(CH_3)$ |
| $(CH_2)_x(OSiR^1{}_3)_2$ | x = 1–6 | 1,2-bis(trimethylsiloxy)ethane<br>$(CH_3)_3SiOCH_2CH_2OSi(CH_3)_3$ |
| $(CH_3)_x(C_6H_{4-x})(OSiR^1{}_3)_2$ | x = 0–4 | 1,4-bis(trimethylsiloxy)benzene<br>$(H_3C)_2SiO$—⌬—$OSi(CH_3)_3$ |
| $(C_xH_y)(OSiR^1{}_3)_2$ | $C_xH_y$ is unsaturated or saturated cyclic, branched, or linear hydrocarbon groups<br>x = 2–10; y = 4–20 | 1,2-bis(trimethylsiloxy)cyclobutene |
| cyclic<br>$(CH_3)_x(C_6H_{4-x}O_2)(SiR^1{}_2)$ | x = 0–4 | (1,2-phenylenedioxy)dimethylsilane) |
| cyclic<br>$(CH_2)_x(CH_2O)_2SiR^1{}_2,$ | x = 0–6 | 1,1-dimethyl-1-sila-2,6-dioxacyclohexane |
| cyclic<br>$(CH_2)_x(CH_2O_2)_2(SiR^1{}_2)_2$ | x = 0–6 | 1,6-bis(dimethylsila)-2,5,7,10-tetraoxacyclodecane |
| cyclic<br>$(CH_2)_x(CH_2O)(SiR^1{}_2)$ | x = 1–6 | 1,1-dimethyl-1-sila-2-oxacyclohe |
| $R^1$—$((R^3O)$—$SiR^2)_x$—$R^1$ | x = 2–6 | 1,2-dimethoxytetramethyldisilane |

TABLE 2

| Organosilicon Precursor | Examples of Substituents | Specific Examples |
|---|---|---|
| $(R^{2'}O)_xSiR^{1'}{}_{(4-x)}$ | $R^1$ and $R^2$ are the same as in Table 1<br>x = 1–3 | pentafluorophenoxytrimethyl silane |

TABLE 2-continued

| Organosilicon Precursor | Examples of Substituents | Specific Examples |
|---|---|---|
| | $R^{1'} = R^1$, F, $CH_{3-y}F_y$ (y = 1–3), $C_2H_{5-y}F_y$ (y = 1–5), $C_6H_{5-y}F_y$ (y = 1–5), $(CH_{3-y}F_y)C_6H_5$ (y = 1–3), cyclic $C_6H_{11-y}F_y$ (y = 1–11) $R^{2'} = R^2$, $CH_{3-y}F_y$ (y = 1–3), $C_2H_{5-y}F_y$ (y = 1–5), $C_6H_{5-y}F_y$ (y = 1–5), $(CH_{3-y}F_y)C_6H_5$ (y = 1–3), cyclic $C_6H_{11-y}F_y$ (y = 1–11) | pentafluorophenoxy dimethylsilane (structure shown) |
| $(CH_{2-y}F_y)_x(OSiR^{1'}_3)_2$ | x = 1–6<br>y = 0–2 | 1,1,1-trifluoroethoxy trimethylsilane $CF_3CH_2OSi(CH_3)_3$<br>dimethoxymethylfluorosilane $(CH_3)(CH_3O)_2SiF$<br>1,2-bis(trimethylsiloxy) tetrafluoroethane $(CH_3)_3SiOCF_2CF_2OSi(CH)$ |
| $(C_6H_{4-x}R^{6'}_x)(OSiR^{1'}_3)_2$ | x = 0–4<br>$R^{6'}$ = F, $CF_3$ | 1,4-(trifluorosiloxy) tetrafluorobenzene (structure with $F_3SiO$ and $OSiF_3$ on tetrafluorobenzene) |
| $(CH_{2-y}F_y)_x(CH_{2-y}F_yO)_2SiR^{1'}_2$ | x = 0–6<br>y = 0–2 | 1,1-dimethyl-1-sila-2,6-dioxahexafluorocyclohexane (ring structure) |
| $R^{1'}-((R^3O)_{2-y}-SiR^{2'}_y)_x-R^{1'}$ | x = 2–6<br>y = 0–2<br>$R^3$ is the same as in Table 1 | 1,2-difluoro-1,2-dimethoxy dimethyldisilane (structure with F-Si-Si-F, OCH₃, CH₃ groups) |

Table 3 presents examples of organosilicon compounds with reactive side groups.

TABLE 3

| Organosilicon Precursor | Examples of Substituents | Specific Examples |
|---|---|---|
| $R^7_3Si(R^8)CH(O)CH_2$ | $R^1$ is the same as in Table 1.<br>$R^7 = R^1$, $OCH_3$, $OCH_2CH_3$<br>$R^8 = (CH_2)_x$, $(CH_2)_xO(CH_2)_y$, $O(CH_2)_x$,<br>x = 0–4, y = 0–4 | 3-glycidoxypropyl trimethyoxysilane $(H_3CO)_3Si$ (structure with epoxide) |
| $R^7_3Si(CH_2)_xC{\equiv}CSiR^7_3$ | x = 0–4 | bis(trimethylsilyl)acetylene $(H_3C)_3Si-C{\equiv}C-Si(CH_3)_3$ |
| $R^7_3Si(CH_2)_xC{\equiv}CR^7$ | x = 0–4 | trimethylsilylacetylene $(H_3C)_3Si-C{\equiv}C-H$ |
| $R^7_3SiO(CH_2)_xC{\equiv}CR^7$ | x = 0–4 | trimethylsiloxyacetylene $(H_3C)_3SiO-C{\equiv}C-H$ |

TABLE 3-continued

| Organosilicon Precursor | Examples of Substituents | Specific Examples |
|---|---|---|
| $R^7_3Si(C_xH_{2x-3})$ | $C_xH_{2x-3}$ is straight chain diene, x = 4–6 | 2-(trimethylsilyl)-1,3-butadiene |
| $R^7_3SiO(C_xH_{2x-3})$ | $C_xH_{2x-3}$ is straight chain diene, x = 4–6 | 1-(trimethylsiloxy)-1,3-butadiene |
| $R^7_3Si(cyclic\text{-}C_xH_{2x-5})$ | $C_xH_{2x-5}$ is cyclic diene, x = 4–8 | trimethylsilyl cyclopentadiene |
| $R^7_3Si(C_6H_{5-x})(R^9)_x$ | x = 1–5, $R^9$ = sterically demanding group, $(CH_3)_3C$, $(CH_3)_2CH$, $Si(CH_3)_{3-y}H_y$, y = 1–3 | 4-(tert-butylphenyl)silane |
| | | 1,2-dimethylsilyl)benzene |
| $R^7_{3-x}Si(CO_2R^3)_x$ | x = 1–3 | Trimethylsilylacetate |
| | | Di-tert-butoxydiacetoxy silane |

The organosilicon precursors of this invention are either commercially available or can be prepared by well known methods.

Examples of commercially available precursors are phenoxytrimethylsilane, dimethoxymethylsilane, 3-glycidoxypropyltrimethoxysilane, bis(trimethylsilyl) acetylene, 1-(trimethylsiloxy)-1,3-butadiene, trimethylsilylcyclopentadiene, and di-tert-butoxydiacetoxysilane.

In general, compounds containing Si—OR bonds such as those in structure types I–VII are available from the exchange reaction of Si—X with an alcohol ROH containing the desired R group (Eaborn, *Organosilicon Compounds*, Academic Press Inc., 1960, p.288). Group X is usually a halide such as Cl⁻, an alkoxide, such as $CH_3O^-$, or another transfer group, such as RNH. For example, $CF_3CH_2OSi(CH_3)_3$ can be prepared in greater than 90% yield from $CF_3CH_2OH$ and $((CH_3)_3Si)_2NH$, with $NH_3$ being the only byproduct (N. R. Patel et. al. *Inorganic Chemistry*, 1994, vol. 33, pages 5465–5470). Similarly, the cyclic compound $(CH_2)(CH_2O)_2Si(CH_3)_2$ can be prepared from the reaction of $(CH_3)_2Si(OCH_3)_2$ with 1,3-propanediol, with the byproduct being removed as methanol (R. H. Krieble et al., *J. Chem. Soc*, 1947, vol. 69, pages 2689–2692). The bridged complexes are also prepared from the diols, such as in the reaction of hydroquinone with $(CH_3)_3SiCl$ to generate 1,4-$((CH_3)_3SiO)_2(C_6H_4)$ and HCl.

The use of silyl ethers of structure types I–VII may also be advantageous when forming porous films because the organic portion of the Si—O—R in the deposited film could be removed after deposition by various thermal or plasma methods, resulting in a film with voids.

Without intending to be bound by theory, it is believed that the use of bidentate silyl ethers (structure IV) as precursors may lead to the production of species in the reacting phase that facilitates deposition of species that ultimately leads to the incorporation of pores in the deposited film, resulting in lower density and thus a lower dielectric constant. The reaction of the bidentate silyl ethers can occur through the formation of larger ring sizes, such as the dimer shown below:

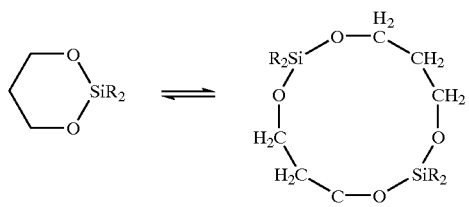

This type of ring expansion may aid in the incorporation of porosity by essentially templating the silicon, carbon, and oxygen atoms in an open structure.

Another attractive aspect of the cyclic bidentate silyl ethers of structure type III or IV is that ring sizes of less than 7 contain ring strain which leads to ring opening polymerization, illustrated below, at higher temperatures.

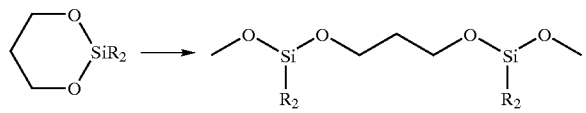

The ring opening may facilitate crosslinking during the deposition process and thus form films with high mechanical strength and thermal stability. Ring opening can be controlled by the energy of the RF plasma or the reaction temperature during film deposition.

The use of bridged silyl ethers of structure types V and VI may also be advantageous when forming porous films because the organic portion of the Si—O—R—O—Si in the deposited film could be removed after deposition by various thermal or plasma methods, resulting in a film with voids.

The use of silyl ether oligomers of structure type VII may be advantageous as ILD film precursors because Si—Si bonds in the precursor have the potential to form highly reactive species such as silylenes or silyl radicals during deposition. These highly reactive species can aid in polymerization and crosslinking in the final film The use of organosilicon precursors containing reactive groups, such as epoxides, dienes, alkynes, and carboxylates, may aid in the polymerization of the film on the substrate. For example, unsaturated carbon-carbon bonds will crosslink, and the epoxides can participate in Si—O bond formation. The film derived from these precursors will be OSG with crosslinked or polymerized substituents that enhance the stability and strength of the film.

In the preparation of an OSG or F-OSG insulating film by PECVD using the organosilicon precursors described above, the organosilicon compound is preferably a liquid or a gas with a boiling point below about 250° C. at atmospheric pressure. The organosilicon compound is introduced in the vapor phase to a reaction chamber in a system similar to that typically used for introducing tetraethylorthosilicate (TEOS) (U.S. Pat. No. Re. 36,623). The ratio of $Si_aO_bC_cH_dF_e$ components in the ILD can be adjusted by choosing a silyl ether precursor with a specific ratio of silicon, oxygen, hydrogen, carbon, and fluorine. In precursors such as $(C_6H_5O)SiH_3$ and $CF_3CH_2OSi(CH_3)_3$, all of the atoms necessary for an OSG or an F-OSG film are present in one molecule. The composition of the film is also dictated by the deposition rate of the organosilane material.

An inert carrier gas is optionally used for introduction of the organosilicon precursor. Examples of a carrier gas are helium, argon, krypton, neon, and nitrogen.

An oxidant, such as oxygen ($O_2$), ozone ($O_3$), nitrous oxide ($N_2O$), nitric oxide (NO), nitrogen dioxide ($NO_2$), dinitrogen tetroxide ($N_2O_4$) and/or hydrogen peroxide ($H_2O_2$), can optionally be added, but may not be necessary if the organosilicon precursor contains oxygen and SiO bonds.

One or more fluorine-providing gases may be used as an additive in the reaction or in a post-treatment. Examples of fluorine-providing gases are $CF_4$, $C_2F_6$, $C_4F_6$, and $C_6F_6$.

It is within the scope of the invention for a single species of molecule to function as more than one of the precursor gas, the oxygen-providing gas and the fluorine-providing gas. That is, the precursor gas, the oxygen-providing gas and the fluorine-providing gas are not necessarily three different gases. For example, it is possible to use dimethoxymethylfluorosilane or trifluoroethoxydimethylsilane to provide silicon, carbon, oxygen and fluorine. It is also possible to use a single gas to act as a precursor and oxygen-providing gas (e.g., dimethoxymethylsilane, diethoxymethylsilane each of which provides carbon, oxygen and silicon), and to use a single gas to act as a precursor and a fluorine-providing gas (e.g., trimethylfluorosilane, which provides carbon, fluorine and silicon).

Although the term "gaseous" is sometimes used herein to describe the reagents, the term is intended to encompass reagents delivered directly as a gas to the reactor, delivered as a vaporized liquid, a sublimed solid and/or transported by an inert carrier gas into the reactor.

In certain embodiments, mixtures of different organosilicon precursors are used in combination. It is also within the scope of the invention to use combinations of different fluorine-providing gases and/or combinations of different oxygen-providing agents along with or separate from combinations of different organosilicon precursors. Moreover, it is also within the scope of the invention to use a fluorinated organosilicon precursor (to provide fluorine and/or carbon) along with a non-fluorinated organosilicon precursor (to provide carbon).

In addition to the organosilicon precursors, and optionally the oxygen-providing gas and the fluorine-providing gas, additional materials can be charged into the vacuum chamber prior to, during and/or after the deposition reaction. Such materials include reactive substances, such as gaseous or liquid organic substances, $NH_3$, $H_2$, $CO_2$, CO, or fluorocarbons. Examples of organic substances are $CH_4$, $C_2H_6$, $C_2H_4$, $C_2H_2$, $C_3H_8$, benzene, naphthalene, toluene and styrene.

Although a single process step is preferred, in many instances it is also within the scope of the invention to post-treat the film after deposition. Such post-treating can include, e.g., at least one of thermal treatment, plasma treatment and chemical treatment to improve one or more of the film properties. For example, thermal post-treatment may provide lower dielectric constants by removing some organic material.

Energy is applied to the gaseous reagents to induce the gases to react and to form the film on the substrate. Such energy can be provided by, e.g., plasma, pulsed plasma, helicon plasma, high density plasma, inductively coupled plasma, and remote plasma methods. A secondary rf frequency source can be used to modify the plasma characteristics at the substrate surface.

The flow rate for each of the gaseous reagents preferably ranges from 10 to 5000 sccm, more preferably from 200 to 2000 sccm, per single 200 mm wafer. Liquid chemical flows are in the range of 0.1 to 10 g/minute, preferably 0.5 to 3 g/minute. The individual rates are selected so as to provide the desired amounts and ratios of silicon, carbon, oxygen, hydrogen, etc. in the film. The actual flow rates needed may depend upon wafer size and chamber configuration, and are in no way limited to 200 mm wafers or single wafer chambers.

It is preferred to deposit the film at a deposition rate of at least 50 nm/min.

The pressure in the vacuum chamber during deposition is preferably 0.01 to 760 torr, more preferably 1 to 20 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 10 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k less than 2.5).

In a typical deposition of a low k film, for example produced in an Applied Materials DxZ chamber (200 mm), flows can range from 10–1000 sccm of precursor (vapor or gas state), 0–6000 sccm oxidizer, 0–5000 sccm inert gas. Activation of reaction in the chamber is generally provided by RF power, typically 100–2000 watts, or thermal energy. The pressure during film deposition is typically from 1 to 20 torr. The flow rates of materials and power levels used are dictated by the desired deposition rate and will also affect the composition of the final film material.

The resulting interlayer dielectric film can have a dielectric constant of 3.5 or less, preferably 3 or less. The final carbon content in the film should be between 0 to 35% (atomic %) for OSG and F-OSG, and the final fluorine content should be 0.1 to 25% (atomic %) in the F-OSG. These films can contain one or more of the following types of bonds: Si—O—C, Si—O—Si, Si—C, Si—F, Si—H, C—O, C—H, and C—F.

It is important to note that an Si—F bond in the deposited film is not necessarily the result of an Si—F bond in the organosilane precursor, but may in fact be formed from the reaction of a C—F bond in the plasma during the deposition.

Certain embodiments of the films are nanoporous relative to silica. Silica produced by PECVD TEOS has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably 5 nm or less in equivalent spherical diameter, more preferably 2.5 nm or less in equivalent spherical diameter.

Films of the invention preferably have a density of 2 g/cc or less, or alternatively, 1.5 g/cc or less. Such low densities can be achieved by adding a porogen to the gaseous reagents and/or post-treating the deposited material.

Films of the invention have improved properties relative to OSG films produced from other candidate materials such as trimethylsilane and dimethyidimethoxysilane. In certain embodiments, the film has a dielectric constant in the range from 2.5 to 3.5, with a Young's modulus greater than 3 GPa and/or a nanoindentation hardness greater than 0.5 GPa.

Films of the invention are thermally stable, with good chemical resistance.

The films are suitable for a variety of uses. The films are particularly suitable for deposition on a semiconductor substrate, and are particularly suitable for use as, e.g., an insulation layer, an interlayer dielectric layer, an intermetal dielectric layer, a capping layer, a chemical-mechanical planarization (CMP) or etch stop layer, a barrier layer (e.g., against diffusion of metals, water or other materials that can be undesirable in insulating layers) and/or an adhesion layer in an integrated circuit. The films can form a conformal coating. The mechanical properties exhibited by these films make them particularly suitable for use in Al subtractive technology and Cu damascene technology.

The films are compatible with chemical mechanical planarization and anisotropic etching, and are capable of adhering to a variety of materials, such as silicon, $SiO_2$, $Si_3N_4$, OSG, FSG, silicon carbide, antireflective coatings, photoresists, organic polymers, porous organic and inorganic materials, metals such as copper and aluminum, and metal barrier layers.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits.

The invention will be further clarified by a consideration of the following examples, which are intended to be purely exemplary of the use of the invention.

EXAMPLES

All experiments were performed on an Applied Materials Precision-5000 system in a 200 mm DxZ chamber fitted with an Advance Energy 2000 rf generator, using an undoped TEOS process kit. The recipe involved the following basic steps: initial set-up and stabilization of gas flows, applying RF energy to generate a plasma and cause deposition, and purge/evacuation of chamber prior to wafer removal. Subsequently, a chamber clean was performed after each deposition using an in situ $C_2F_6+O_2$ clean followed by a chamber seasoning step.

Dielectric constants were determined using Hg probe technique on low resistivity p-type wafers (<0.02 ohm-cm). Transmission infrared spectroscopy was performed on high resistivity wafers and all data were normalized based on film thickness. Thickness and refractive index were measured on reflectometer using a 5 point average. Adhesion was measured by a tape pull test. Mechanical properties (e.g. Young's modulus and nanoindentation hardness) were determined using MTS Nano Indenter standardized with the manufacturer. Compositional data were obtained by x-ray photoelectron spectroscopy (XPS) after a 30 second Ar sputter. The atomic % values reported in the tables include hydrogen ratios as determined by Rutherford Backscattering-Hydrogen Forward Scattering (RBS-HFS).

The inventive examples shown below in Table 4 are based on an organosilicon precursor of structure II, $(R^3O)_ySiH R^1_{(3-y)}$, specifically diethoxymethylsilane.

Comparative Examples 1 and 2 were produced in accordance with the teachings of U.S. Pat. Nos. 6,159,871, 6,054,379, and WO 99/41123, and are tabulated in Table 5 below. Comparative examples are also shown in Table 6 for dimethyldimethoxysilane (DM-DMOS), a material similar to structure II precursors, however lacking various aspects of the structure II precursors, such as for example an Si—H functionality.

TABLE 4

Data for diethoxymethylsilane (DEMS) material

| Example No. | 1 | 2 | 3 |
|---|---|---|---|
| RF power (W) | 100 | 300 | 500 |
| chamber pressure (torr) | 6.0 | 6.0 | 6.0 |
| substrate temperature (° C.) | 390 | 390 | 390 |
| Materials flows | | | |
| DEMS (mg/min) | 1500 | 1000 | 1500 |
| He carrier (sccm) | 500 | 150 | 150 |
| $O_2$ (sccm) | 50 | 0 | 0 |
| $CO_2$ (sccm) | 0 | 0 | 250 |
| thickness (nm) | 515 | 640 | 565 |
| refractive index | 1.405 | 1.451 | 1.47 |
| dielectric constant (k) | 2.99 | 2.90 | 3.06 |
| Adhesion (qualitative) | 100% | 100% | 100% |
| Young's modulus (GPa) | 18.5 | 16.5 | 17.3 |
| nanoindentation hardness (GPa) | 3.0 | 2.8 | 2.9 |
| Composition (XPS) | | | |
| % C | 14.4 | 17.5 | 17.3 |
| % Si | 35.5 | 34.8 | 35.3 |
| % O | 50.1 | 47.7 | 47.4 |
| % N | 0 | 0 | 0 |
| RBS-HFS data | | | |
| ratio Si:H | 0.73 | 0.69 | 0.69 |
| ratio H:C | 3 | 3.2 | 3.2 |

TABLE 5

Comparative Data for trimethylsilane (3MS) material

| Comparative Example No. | 1 |
|---|---|
| RF power (W) | 600 |
| chamber pressure (torr) | 4.0 |
| substrate temperature (° C.) | 325 |
| Materials flows | |
| 3MS (sccm) | 540 |
| $O_2$ (sccm) | 90 |
| thickness (nm) | 676 |
| refractive index | 1.445 |
| dielectric constant (k) | 2.85 |
| adhesion | 100% |
| Young's modulus (GPa) | 8.76 |
| nanoindentation hardness (GPa) | 1.44 |
| Elemental (XPS)* | |
| % C | 23–26 |
| % Si | 35 |
| % O | 39–41 |
| % N | 0 |
| RBS-HFS data* | |
| ratio Si:H | 0.63–0.85 |
| ratio H:C | 1.6–2.4 |

*averaged values from samples produced at identical process conditions

TABLE 6

Comparative Data for Dimethyldimethoxysilane (DM-DMOS)

| Comparative Example No. | 2 | 3 | 4 |
|---|---|---|---|
| RF power (W) | 600 | 450 | 450 |
| chamber pressure (torr) | 8.0 | 8.0 | 12.0 |
| substrate temperature (° C.) | 325 | 325 | 325 |
| Materials flows | | | |
| DM-DMOS (mg/min) | 1500 | 1500 | 1500 |
| He carrier (sccm) | 500 | 500 | 500 |
| $O_2$ (sccm) | 0 | 50 | 50 |
| $N_2O$ (sccm) | 50 | 0 | 0 |
| thickness (nm) | 1005 | 1126 | 707 |
| refractive index | 1.447 | 1.432 | 1.409 |
| dielectric constant (k) | 3.11 | 3.07 | 2.88 |
| adhesion (qualitative) | 100% | 100% | 100% |
| Young's modulus (GPa) | 13.6 | 10.6 | 6.68 |
| nanoindentation hardness (GPa) | 2.3 | 1.86 | 1.2 |

The data presented in Tables 4, 5, and 6 show that diethoxymethylsilane (an organosilicon precursor of structure II) unexpectedly showed superior mechanical properties as indicated by Young's modulus and nanoindentation hardness, compared to the precursors (trimethylsilane and dimethyldimethoxysilane) in the comparative examples. For example, comparing inventive example #2 (k of 2.90) to comparative examples #1 (k=2.85) and #4 (k=2.88), inventive example #2 has a Young's modulus of 16.5 and a nanoindentation hardness of 2.8 compared to a Young's modulus of 8.76 and hardness of 1.44 for comparative example #1 and a Young's modulus of 6.68 and hardness of 1.2 for comparative example #4. It is noteworthy that for inventive example #2 there was no oxidant type gases incorporated in the recipe, such that all O in the final film necessarily came from the alkoxy functionality of the organosilane precursor. Also, comparing inventive examples #1–3 to comparative examples #2, 3, and 4, the inventive examples unexpectedly showed far superior mechanical properties to the comparative examples produced from dimethyldimethoxysilane.

In comparing each of the best cases with respect to k, e.g., inventive example #2 compared to comparative examples #1 and #4, inventive example #2 unexpectedly showed that far superior mechanical properties can be obtained at essentially equivalent dielectric constant values.

Comparing inventive example #2 with comparative example #1, it is shown that the inventive material has a lower C content and higher O content. The increased O content in inventive example #2 likely attributes to better network structure formation and thus may be responsible for the improved mechanical properties.

Comparison of the H:C ratios for inventive example #2 to comparative example #1 indicates that there is a substantial increase in the amount of H relative to C in inventive example #2.

Transmission infrared spectra are shown in FIG. 1 for inventive examples #1–3 and comparative example #1. Data collected from these spectra are shown in Table 7. The data indicates that residual Si—H (~2200 $cm^{-1}$) and O—H functionality (at ~3700 $cm^{-1}$) in the invention examples was equal to or less than residual Si—H or O—H functionality in the comparative example.

Without intending to be bound by theory, we infer that for the inventive examples the carbon must be essentially all in the form of methyl functionalities (i.e., —$CH_3$) to account for the high H:C ratio. We also infer that, based on the Si:C ratio (~2), approximately every other Si has a —CH₃ bound to it. For the comparative examples this need not be so, as there can be various amounts of the entire range of populations of H substituted C, including CH₃, CH₂, CH, and Si—C (inorganic carbon, not having any directly connected H). This might account for the H:C ratio being far less than the optimum H:C ratio of 3 for the C to be essentially all in the form of —CH₃.

TABLE 7

Quantitative IR information for inventive examples #1–3 versus comparative example #1
(absorbencies normalized to film thickness)

| Band (cm-1)/ absorbance | Comparative example #1 | Inventive example #1 | Inventive example #2 | Inventive example #3 |
|---|---|---|---|---|
| 3738 | ND | ND | ND | ND |
| 2971 | 0.021 | 0.019 | 0.014 | 0.011 |
| 2235 | 0.0049 | ND | 0.0065 | 0.053 |
| 2158 | 0.0045 | ND | 0.0033 | 0.0007 |
| 1278 | 0.065 | 0.080 | 0.057 | 0.043 |
| 1033 | 0.272 | 0.391 | 0.358 | 0.437 |
| Band (cm-1)/ Band Areas | | | | |
| 3039–2769 (CH₃) | 1.18 | 0.42 | 0.69 | 0.47 |
| 2370–2073 (SiH) | 0.55 | ND | 0.55 | 0.29 |
| 1325–1240 (SiCH₃) | 1.40 | 1.19 | 0.97 | 0.44 |
| 1240–944 (SiOSi) | 40.21 | 44.88 | 48.86 | 56.50 |

ND = not detectable

PROSPECTIVE EXAMPLES

Example 7

A prospective example of the invention based on using dimethoxymethylsilane (DMOMS) as the organosilane precursor is shown in Table 8 below for a 200 mm silicon wafer substrate.

TABLE 8

| Chamber Pressure (torr) | 6.0 |
|---|---|
| Substrate temperature (° C.) | 400 |
| RF power (Watts) | 300 |
| DMOMS (g/min) | 1.0 |
| CO₂ carrier (sccm) | 200 |

The expected k value will be in the range of 2.7 to 3.0, with a Young's modulus of about 15 GPa and a nanoindentation hardness of about 2 GPa.

A prospective example of the invention based on using phenoxydimethylsilane (PODMS) as the organosilane precursor is shown in Table 9 below for a 200 mm silicon wafer substrate.

TABLE 9

| Chamber Pressure (torr) | 6.0 |
|---|---|
| Substrate temperature (° C.) | 400 |
| RF power (Watts) | 300 |
| PODMS (g/min) | 1.0 |
| CO₂ carrier (sccm) | 200 |

The expected k value will be in the range of 2.7 to 3.0, with a Young's modulus of about 15 GPa and a nanoindentation hardness of about 2 GPa.

A prospective example of the invention based on using di-tert-butoxymethylsilane (DTBMS) as the organosilane precursor is shown in Table 10 below for a 200 mm silicon wafer substrate.

TABLE 10

| Chamber Pressure (torr) | 6.0 |
|---|---|
| Substrate temperature (° C.) | 400 |
| RF power (Watts) | 300 |
| DTBMS (g/min) | 1.0 |
| CO₂ carrier (sccm) | 200 |

The expected k value will be in the range of 2.7 to 3.0, with a Young's modulus of about 15 GPa and a nanoindentation hardness of about 2 GPa.

A prospective example of the invention based on using dimethyldioxosilylylcyclohexane (DM-DOSH) as the organosilane precursor is shown in Table 11 below for a 200 mm silicon wafer substrate.

TABLE 11

| Chamber Pressure (torr) | 8.0 |
|---|---|
| Substrate temperature (° C.) | 350 |
| RF power (Watts) | 300 |
| DM-DOSH (g/min) | 1.0 |
| He carrier (sccm) | 200 |

The expected k value will be in the range of 2.7 to 3.0, with a Young's modulus of about 15 GPa and a nanoindentation hardness of about 2 GPa.

While the invention has been described in detail and with reference to specific examples thereof, it will be apparent to one skilled in the art that various changes and modifications can be made therein without departing from the spirit and scope thereof.

What is claimed is:

1. A method of forming a low dielectric constant interlayer dielectric film comprising reacting, under chemical vapor deposition conditions sufficient to deposit a film on a substrate, an organosilicon precursor comprising one or more silyl ether, represented by one or more of structures I through III, or a silyl ether oligomer, represented by structure IV:

 (I)

$(R^2O)_x SiR^1_{(4-x)}$

 (II)

$(R^3O)_y SiHR^1_{(3-y)}$

 (III)

$R^1_3 Si—O—R^4—O—SiR^1_3$

 (IV)

$R^1-((R^3O)-Si-(R^1))_z-R^1$ wherein x is an integer from 1 to 3; y is 1 or 2; z is an integer from 2 to 6; R¹ is one or more of H, fluorine, a branched or straight chain C1 to C6 alkyl, a C3 to C8 substituted or unsubstituted cycloalkyl, a C6 to C12 substituted or unsubstituted aromatic, a partially or fully fluorinated C1 to C6 alkyl, a partially or fully fluorinated C3 to C8 cycloalkyl, or a partially or fully fluorinated C6 to C12 aromatic;

R² is one or more of a C6 to C12 substituted or unsubstituted aromatic, a partially or fully fluorinated C1 to C6 straight or branched chain alkyl, a partially or fully fluorinated C3 to C8 cycloalkyl, or a partially or fully fluorinated C6 to C12 aromatic, R³ is one or more of R², a C1 to 6 linear or branched alkyl, or a C3 to C8 substituted or unsubstituted cycloalkyl; and R⁴ is one or more of a branched or straight chain C1 to C6 alkyl, a C3 to C8 substituted or unsubstituted cycloalkyl, a C6 to C12 substituted or unsubstituted aromatic, a partially or fully fluorinated branched or straight chain C1 to C6 alkyl, a partially or fully fluorinated C3 to C8 cycloalkyl, or a partially or fully fluorinated C6 to C12 aromatic; optionally together with one or more additional reactive substance;

to form an interlayer dielectric film having a dielectric constant of about 3.5 or less.

2. A method of forming a low dielectric constant interlayer dielectric film comprising reacting, under chemical vapor deposition conditions sufficient to deposit a film on a substrate, an organosilicon precursor comprising one or more organosilicon compound containing one or more reactive side group selected from the group consisting of a C2 to C10 epoxide, a C2 to C8 carboxylate, a C2 to C8 alkyne, a C4 to C8 diene, a C3 to C5 strained cyclic group, and a C4 to C10 group that can sterically hinder or strain the organosilicon precursor; optionally together with one or more additional reactive substance; to form an interlayer dielectric film having a dielectric constant of 3.5 or less.

3. The method of claim 1 where the organosilicon compound is selected from the group consisting of phenoxytrimethylsilane, 2-tert-butyl-phenoxytrimethylsilane, dimethylethoxysilane, dimethoxymethylsilane, 1,2-bis(trimethylsiloxy)ethane, 1,4-bis(trimethylsiloxy)benzene, 1,2-bis(trimethylsiloxy)cyclobutene, 1,2-dimethoxytetramethyldisilane, pentafluorophenoxytrimethylsilane, 1,1,1-trifluoroethoxytrimethylsilane, 1,1,1-trifuoroethoxydimethylsilane, dimethyoxymethylfluorosilane, 1,2-bis(trimethylsiloxy)tetrafluoroethane, 1,4-(trifluorosiloxy)tetrafluorobenzene, 1,2-difluoro-1,2-dimethoxydimethyldisilane, and mixtures thereof.

4. The method of claim 2 wherein the organosilicon precursor is selected from the group consisting of 3-glycidoxypropyltrimethyoxysilane, trimethylsilylacetylene, bis(trimethylsilyl)acetylene, trimethylsiloxyacetylene, 1-(trimethylsiloxy)-1,3-butadiene, 2-(trimethylsilyl)-1,3-butadiene, trimethylsilylcyclopentadiene, 4-(tert-butylphenyl)silane, 1,2-(dimethylsilyl)benzene, trimethylsilylacetate, di-tert-butoxydiacetoxy silane, and mixtures thereof.

5. The method of claim 1 wherein the interlayer dielectric film is represented by the formula, $Si_aO_bC_cH_dF_e$, wherein, on an atomic % basis, a=10–35%, b=1–66%, c=1–35%, d=0–60%, and e=0–25%, such that a+b+c+d+e=100%.

6. The method of claim 1 wherein the chemical vapor deposition conditions are plasma enhanced chemical vapor deposition conditions.

7. The method of claim 1 wherein the chemical vapor deposition conditions are thermal chemical vapor deposition conditions.

8. The method of claim 1 wherein the substrate is a silicon wafer.

9. The method of claim 1 wherein the interlayer dielectric film has one or more of the bond types selected from Si—O—C, Si—O—Si, Si—C, Si—F, Si—H, C—O, C—H, and C—F.

10. The method of claim 1 wherein the dielectric constant is 3 or less.

11. The method of claim 1 wherein the interlayer dielectric film is porous.

12. The method of claim 1 wherein the chemical vapor deposition conditions include the use of an oxidant selected from the group consisting of $O_2$, $O_3$, $H_2O_2$, $N_2O$, and mixtures thereof.

13. The method of claim 1 wherein the chemical vapor deposition conditions exclude the use of an oxidant.

14. The method of claim 1 wherein the chemical vapor deposition conditions include the use of one or more inert gases selected from the group consisting of helium, neon, argon, krypton, xenon, nitrogen.

15. The method of claim 1 wherein the one or more reactive substances is selected from the group consisting of a gaseous or liquid organic substance, ammonia, hydrogen, carbon dioxide, carbon monoxide, a fluorocarbon, and mixtures thereof.

16. The method of claim 15 wherein the gaseous or liquid organic substance is selected from the group consisting of methane, ethane, ethene, ethyne, propane, propene, butene, benzene, naphthalene, toluene, styrene, and mixtures thereof, and the fluorocarbon is selected from the group consisting of $CF_4$, $C_2F_6$, $C_4F_6$, $C_6F_6$, and mixtures thereof.

17. The method of claim 1 wherein the film is deposited on the substrate as an insulation layer, an interlayer dielectric layer, an intermetal dielectric layer, a capping layer, a chemical-mechanical planarization or etch stop layer, a barrier layer, or an adhesion layer in an integrated circuit.

18. The method of claim 2 wherein the interlayer dielectric film is represented by the formula, $Si_aO_bC_cH_dF_e$, wherein, on an atomic % basis, a=10–35%, b=1–66%, c=1–35%, d=0–60%, and e=0–25%, such that a+b+c+d+e=100%.

19. The method of claim 2 wherein the chemical vapor deposition conditions are plasma enhanced chemical vapor deposition conditions.

20. The method of claim 2 wherein the chemical vapor deposition conditions are thermal chemical vapor deposition conditions.

21. The method of claim 2 wherein the substrate is a silicon wafer.

22. The method of claim 2 wherein the interlayer dielectric film has one or more of the bond types selected from Si—O—C, Si—O—Si, Si—C, Si—F, Si—H, C—O, C—H, and C—F.

23. The method of claim 2 wherein the dielectric constant is 3 or less.

24. The method of claim 2 wherein the interlayer dielectric film is porous.

25. The method of claim 2 wherein the chemical vapor deposition conditions include the use of an oxidant selected from the group consisting of $O_2$, $O_3$, $H_2O_2$, $N_2O$, and mixtures thereof.

26. The method of claim 2 wherein the chemical vapor deposition conditions exclude the use of an oxidant.

27. The method of claim 2 wherein the chemical vapor deposition conditions include the use of one or more inert gases selected from the group consisting of helium, neon, argon, krypton, xenon, nitrogen.

28. The method of claim 2 wherein the one or more reactive substances selected from the group consisting of a gaseous or liquid organic substance, ammonia, hydrogen, carbon dioxide, carbon monoxide, a fluorocarbon, and mixtures thereof.

29. The method of claim 28 wherein the gaseous or liquid organic substance is selected from the group consisting of methane, ethane, ethene, ethyne, propane, propene, butene, benzene, naphthalene, toluene, styrene, and mixtures thereof, and the fluorocarbon is selected from the group consisting of $CF_4$, $C_2F_6$, $C_4F_6$, $C_6F_6$, and mixtures thereof.

30. The method claim 2 wherein the film is deposited on the substrate as an insulation layer, an interlayer dielectric layer, an intermetal dielectric layer, a capping layer, a chemical-mechanical planarization or etch stop layer, a barrier layer, or an adhesion layer in an integrated circuit.

31. The method of claim 1 wherein the chemical vapor deposition conditions are plasma enhanced chemical vapor deposition conditions and the one or more silyl ether is represented by structure II.

32. A film formed by the method of claim 1.

33. A film formed by the method of claim 2.

34. A film formed by the method of claim 31.

35. The film of claim 32, wherein said film is porous.

36. The film of claim 35 having a pore size of 5 nm or less equivalent spherical diameter, as determined by small angle neutron scattering or positron annihilation lifetime spectroscopy.

37. The film of claim 35 having a pore size of 2.5 nm or less equivalent spherical diameter, as determined by small angle neutron scattering or positron annihilation lifetime spectroscopy.

38. The film of claim 32 wherein said film has a density of 2 g/cc or less.

39. The film of claim 32 wherein said film has a density of 1.5 g/cc or less.

40. The film of claim 32 wherein said film has a dielectric constant of 2.5 to 3.5 and a Young's modulus greater than 3 GPa and/or a nanoindentation hardness greater than 0.5 GPa.

41. The film of claim 33, wherein said film is porous.

42. The film of claim 41 having a pore size of 5 nm or less equivalent spherical diameter, as determined by small angle neutron scattering or positron annihilation lifetime spectroscopy.

43. The film of claim 41 having a pore size of 2.5 nm or less equivalent spherical diameter, as determined by small angle neutron scattering or positron annihilation lifetime spectroscopy.

44. The film of claim 33 wherein said film has a density of 2 g/cc or less.

45. The film of claim 33 wherein said film has a density of 1.5 g/cc or less.

46. The film of claim 33 wherein said film has a dielectric constant of 2.5 to 3.5 and a Young's modulus greater than 3 GPa and/or a nanoindentation hardness greater than 0.5 GPa.

47. A method of forming a low dielectric constant interlayer dielectric film comprising reacting, under chemical vapor deposition conditions sufficient to deposit a film on a substrate, an organosilicon precursor comprising one or more silyl ether selected train the group consisting of diethoxymethylsilane, dimethylethoxysilane, dimethoxymethylsilane, dimethylmethoxysilane, phenoxydimethylsilane, diphenoxymethylsilane, dimethoxyphenylsilane, diethoxycyclohexyrsilane, tert-butoxydimethylsilane, and di(tert-butoky)methylsilane; to form an interlayer dielectric film having a dielectric constant of about 3.5 or less.

48. The method of claim 47 the chemical vapor deposition conditions are plasma enhanced chemical vapor deposition conditions.

49. The method of claim 48 wherein the plasma enhanced chemical vapor deposition conditions include the use of one or more gases selected from the group consisting of carbon dioxide, argon, helium, nitrogen, oxygen, nitrous oxide, hydrogen peroxide and ozone.

50. The method of claim 48 wherein the organosilicon precursor is diethoxymethylsilane.

51. The method of claim 50 wherein the plasma enhanced chemical vapor deposition conditions include the use of carbon dioxide or helium.

52. A method of forming a low dielectric constant interlayer dielectric film which comprises reading diethoxymethylsilane, under plasma vapor deposition conditions sufficient to deposit a film on a substrate, in the presence of carbon dioxide or helium, to form an interlayer dielectric film having a dielectric constant of about 2.5 to 3.5.

53. A film formed by the method of claim 47.

54. A film formed by the method of claim 48.

55. A film formed by the method of claim 50.

56. A film formed by the method of claim 52.

* * * * *

UNITED STATES PATENT AND TRADEMARK OFFICE
CERTIFICATE OF CORRECTION

PATENT NO. : 6,583,048 B2
DATED : June 24, 2003
INVENTOR(S) : Jean Louise Vincent et al.

It is certified that error appears in the above-identified patent and that said Letters Patent is hereby corrected as shown below:

Column 20,
Line 43, delete "VII" and substitute therefore -- IV --.

Column 24,
Line 13, delete the word "di(tert-butoky)" and substitute therefore
-- di(tert-butoxy) --.
Line 30, delete the word "reading" and substitute therefore -- reacting --.

Signed and Sealed this

Seventh Day of October, 2003

JAMES E. ROGAN
*Director of the United States Patent and Trademark Office*